(12) United States Patent
Dry et al.

(10) Patent No.: US 10,500,994 B1
(45) Date of Patent: Dec. 10, 2019

(54) TEMPERATURE CONTROLLED VENTILATION SYSTEM FOR SEATING ASSEMBLY

(71) Applicant: Ford Global Technologies, LLC, Dearborn, MI (US)

(72) Inventors: Alan George Dry, Grosse-Pointe Woods, MI (US); Johnathan Andrew Line, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/003,578

(22) Filed: Jun. 8, 2018

(51) Int. Cl.
  *B60N 2/56* (2006.01)
  *F25B 21/04* (2006.01)

(52) U.S. Cl.
  CPC ......... *B60N 2/5692* (2013.01); *B60N 2/5657* (2013.01); *F25B 21/04* (2013.01); *F25B 2321/0212* (2013.01)

(58) Field of Classification Search
  CPC ...... B60N 2/5692; B60N 2/5657; F25B 21/04
  USPC ..................................................... 297/180.12
  See application file for complete search history.

(56) References Cited

U.S. PATENT DOCUMENTS

| | | | |
|---|---|---|---|
| 5,597,200 A | 1/1997 | Gregory et al. | |
| 5,626,021 A | 5/1997 | Karunasiri et al. | |
| 6,079,485 A | 6/2000 | Esaki et al. | |
| 6,119,463 A * | 9/2000 | Bell | B60H 1/00471 165/86 |
| 6,291,803 B1 | 9/2001 | Fourrey | |
| 7,178,344 B2 | 2/2007 | Bell | |
| 7,320,357 B2 | 1/2008 | Pause | |
| 7,475,464 B2 | 1/2009 | Lofy et al. | |
| 7,640,754 B2 | 1/2010 | Wolas | |
| 7,966,835 B2 | 6/2011 | Petrovski | |
| 8,359,871 B2 | 1/2013 | Woods et al. | |

(Continued)

FOREIGN PATENT DOCUMENTS

| CN | 101119871 A | 2/2008 |
|---|---|---|
| CN | 201890168 U | 7/2011 |

(Continued)

OTHER PUBLICATIONS

Elarusi, Abdulmunaem H., "Optimal Design of a Thermoelectric Cooling/Heating System for Car Seat Climate Control (CSCC)" 2016. Master's Theses. 720.

(Continued)

*Primary Examiner* — Mark R Wendell
(74) *Attorney, Agent, or Firm* — Vichit Chea; Price Heneveld LLP

(57) ABSTRACT

A temperature controlled ventilation system for a vehicle seating assembly which includes a thermoelectric module. A thermoelectric device is disposed within a housing which includes a first chamber, a second chamber, an inlet port, a first outlet port disposed in the first chamber, and a second outlet port disposed in the second chamber. An inlet tube is coupled to the inlet port. An air mover is used for moving air through the inlet tube, into the inlet port and into the first and second chambers. The thermoelectric device is selectively and alternatively operable to cool air in the first chamber and to heat air in the second chamber or to heat air in the first chamber and to cool air in the second chamber.

11 Claims, 12 Drawing Sheets

(56) References Cited

U.S. PATENT DOCUMENTS

| | | |
|---|---|---|
| 8,702,164 B2 | 4/2014 | Lazanja et al. |
| 9,105,808 B2 | 8/2015 | Petrovski |
| 9,105,809 B2 | 8/2015 | Lofy |
| 9,272,647 B2 | 3/2016 | Gawade et al. |
| 9,310,112 B2 | 4/2016 | Bell et al. |
| 9,335,073 B2 | 5/2016 | Lofy |
| 9,366,461 B2 | 6/2016 | Bell et al. |
| 9,440,567 B2 | 9/2016 | Lazanja et al. |
| 9,676,310 B2 | 6/2017 | Fitzpatrick et al. |
| 2006/0087160 A1 | 4/2006 | Dong et al. |
| 2006/0175877 A1 | 8/2006 | Alionte et al. |
| 2006/0208540 A1 | 9/2006 | Lofy et al. |
| 2006/0284455 A1* | 12/2006 | Terech ............... B60N 2/5635 297/180.14 |
| 2009/0033130 A1 | 2/2009 | Marquette et al. |
| 2010/0274396 A1* | 10/2010 | Yang ................ B60H 1/00385 700/278 |
| 2010/0327637 A1 | 12/2010 | Bajic et al. |
| 2011/0061401 A1* | 3/2011 | Jun ..................... B60N 2/5657 62/3.3 |
| 2012/0080911 A1 | 4/2012 | Brykalski et al. |
| 2012/0114512 A1* | 5/2012 | Lofy ................... F04D 29/4226 417/410.1 |
| 2013/0097777 A1 | 4/2013 | Marquette et al. |
| 2014/0060795 A1* | 3/2014 | Yu ..................... B60H 1/00821 165/202 |
| 2015/0048658 A1* | 2/2015 | Gawade ............... B60N 2/5678 297/180.12 |
| 2015/0069798 A1 | 3/2015 | Bajic et al. |
| 2015/0266405 A1 | 9/2015 | Fitzpatrick et al. |
| 2016/0009206 A1 | 1/2016 | Perraut et al. |
| 2016/0052362 A1* | 2/2016 | Thomas ................. B60N 2/80 62/3.3 |
| 2016/0137110 A1 | 5/2016 | Lofy et al. |
| 2018/0056835 A1* | 3/2018 | Konrad ................. H01L 35/325 |
| 2018/0170223 A1* | 6/2018 | Wolas ................... B60N 2/565 |

FOREIGN PATENT DOCUMENTS

| | | |
|---|---|---|
| CN | 203651539 U | 6/2014 |
| DE | 102013021199 A1 | 7/2014 |

OTHER PUBLICATIONS

Dr. HoSung Lee, "Optimal Design of a Thermoelectric Cooling/Heating for Car Seat Comfort" Oct. 18, 2014.

* cited by examiner

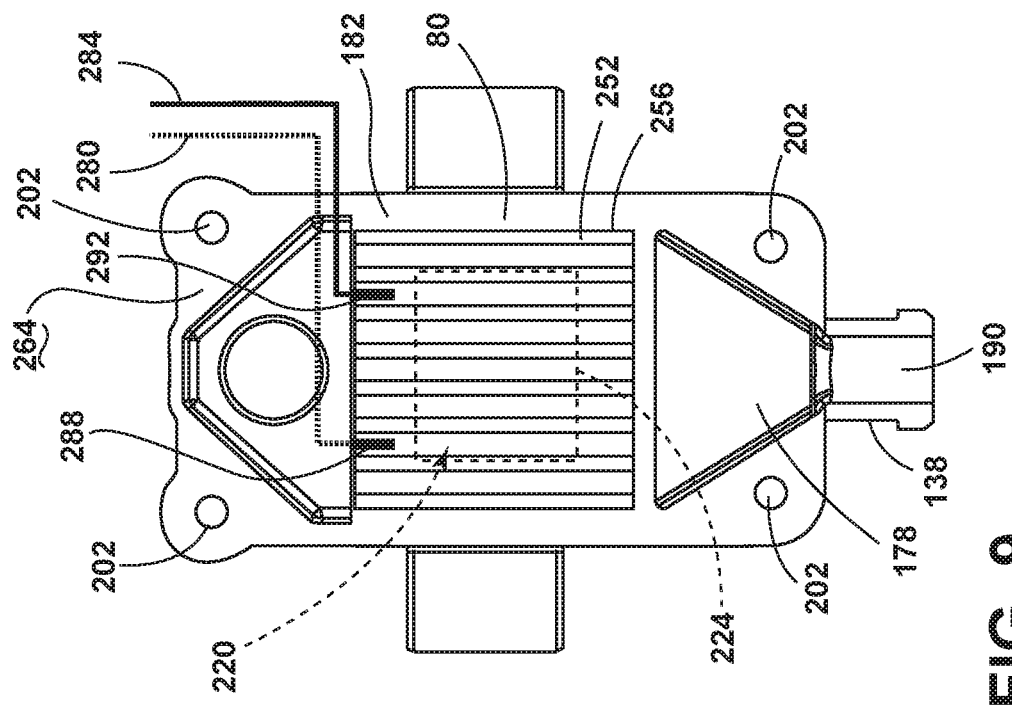
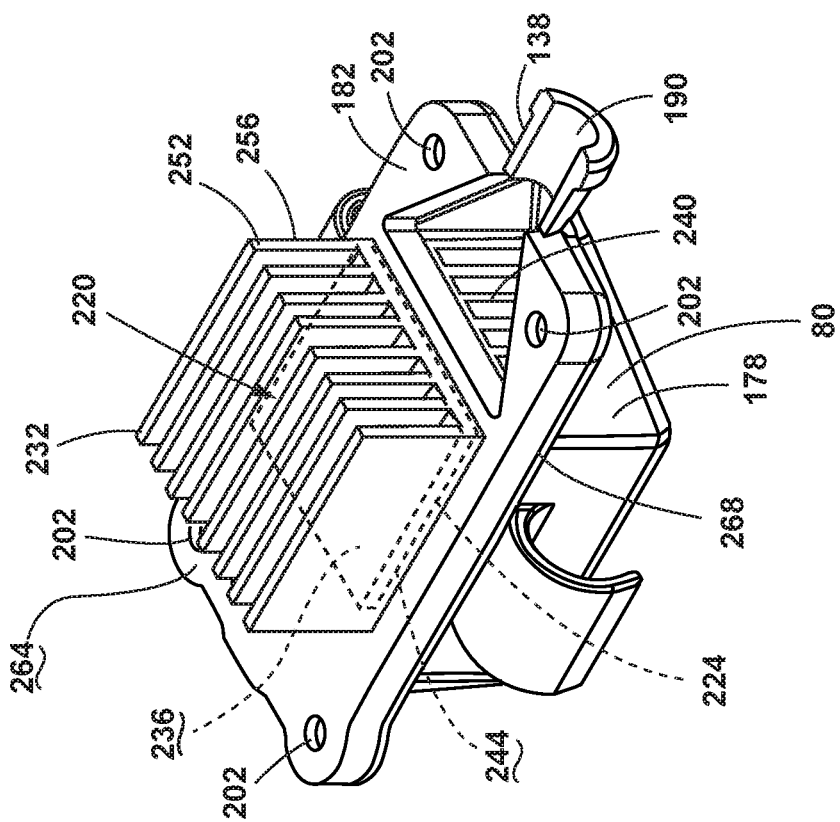

TEMPERATURE CONTROLLED VENTILATION SYSTEM FOR SEATING ASSEMBLY

FIELD OF THE DISCLOSURE

The present disclosure generally relates to a vehicle seating assembly, and more particularly to a vehicle seating assembly having cooling and heating.

BACKGROUND OF THE DISCLOSURE

Vehicle seat comfort has become increasingly important as occupants take longer trips. Providing cooling and heating of the seat can increase the comfort of passengers.

A variety of vehicle seating assemblies that provide for occupant cooling and heating are known. However, current solutions for providing cooling and heating often can be inadequate for cooling and heating a seated passenger. Further, current solutions for providing cooling and heating may not cool and heat the passenger efficiently.

SUMMARY OF THE DISCLOSURE

According to one embodiment of the present disclosure, a temperature controlled ventilation system for a vehicle seating assembly includes a thermoelectric module. A thermoelectric device is disposed within a housing which includes a first chamber, a second chamber, an inlet port, a first outlet port disposed in the first chamber, and a second outlet port disposed in the second chamber. An inlet tube is coupled to the inlet port. An air mover is used for moving air through the inlet tube, into the inlet port and into the first and second chambers. The thermoelectric device is selectively and alternatively operable to cool air in the first chamber and to heat air in the second chamber or to heat air in the first chamber and to cool air in the second chamber.

Aspects of the first embodiment of the disclosure can include any one or a combination of the following features:
- the housing further includes a first shell and a second shell;
- an elastomeric gasket disposed between the first shell and the second shell, wherein the thermoelectric device is disposed in an aperture in the elastomeric gasket;
- the first chamber is located between a wall defined by the elastomeric gasket and the thermoelectric device and the first shell, and wherein the second chamber is located between the wall defined by the elastomeric gasket and the thermoelectric device and the second shell;
- a first heat sink disposed on a first surface of the thermoelectric device;
- a second heat sink disposed on a second surface of the thermoelectric device;
- the first heat sink includes one or more fins extending from the first surface of the thermoelectric device into the first chamber, and wherein the second heat sink includes one or more fins extending from the second surface of the thermoelectric device into the second chamber;
- the one or more fins extend from the first surface of the thermoelectric device to the first shell, and the one or more fins extend from the second surface of the thermoelectric device to the second shell;
- a thermally conductive adhesive disposed between the first surface of the thermoelectric device and the first heat sink and the second surface of the thermoelectric device and the second heat sink;
- a first outlet tube comprising a first end and a second end, wherein the first end is attached to the first outlet port and the second end is disposed proximate a seating surface;
- a channel in a seat cushion, wherein the channel comprises a first end and a second end, and wherein the first end is adjacent to the first outlet port and the second end is disposed proximate a seating surface;
- the thermoelectric module comprises a first thermoelectric module and a second thermoelectric module, wherein the first thermoelectric module includes a first inlet tube and the second thermoelectric module includes a second inlet tube, and wherein the second thermoelectric module is coupled to the first inlet tube; and/or
- the second thermoelectric module includes a clip integral to the housing of the second thermoelectric module and wherein the clip is secured to the first inlet tube.

According to a second embodiment of the present disclosure, a thermally conductive ventilation system includes first and second thermoelectric module and an air mover. First and second inlet tubes deliver air from the air mover to the respective first and second thermoelectric modules. Thermoelectric devices are disposed within the first and second thermoelectric modules and are selectively and alternatively operable to heat and cool air within first and second chambers in the first and second thermoelectric modules.

Aspects of the second embodiment of the disclosure can include any one or a combination of the following features:
- the first and second thermoelectric modules include respective first and second housings, wherein a first clip is disposed on the first housing, wherein a second clip is disposed on the second housing, and wherein the second clip is attached to the first inlet tube;
- the first and second thermoelectric modules are disposed above a seat pan;
- the first and second thermoelectric modules are disposed below a seat pan;
- third, fourth, and fifth thermoelectric modules, wherein the third, fourth, and fifth thermoelectric modules comprise third, fourth, and fifth housings; and/or
- third, fourth, and fifth inlet tubes coupled to the respective third, fourth, and fifth thermoelectric modules, wherein the third housing is coupled to the first and second inlet tubes, the fourth housing is coupled to the first, second, and third inlet tubes, and the fifth housing is coupled to the first, second, third, and fourth inlet tubes.

According to a third embodiment of the present disclosure, a vehicle seating assembly includes first and second thermoelectric modules disposed between a cushion and a cushion support structure. The first and second inlet tubes deliver air from an air mover to the first and second thermoelectric modules. The first and second thermoelectric modules expel conditioned air to the seating surface and waste air away from the seating surface. The second thermoelectric module is attached to the first inlet tube.

Aspects of the third embodiment of the disclosure can include any one or a combination of the following features:
- the cushion is a seat cushion and the cushion support structure is a seat pan; and/or
- the cushion is a seatback cushion and the cushion support structure is a seatback frame.

These and other aspects, objects, and features of the present disclosure will be understood and appreciated by those skilled in the art upon studying the following specification, claims, and appended drawings.

BRIEF DESCRIPTION OF THE DRAWINGS

In the drawings:

FIG. 8 is a back perspective view of a portion of a thermoelectric module;

FIG. 9 is a top elevational view of a portion of a thermoelectric module;

DETAILED DESCRIPTION

Figure 1:
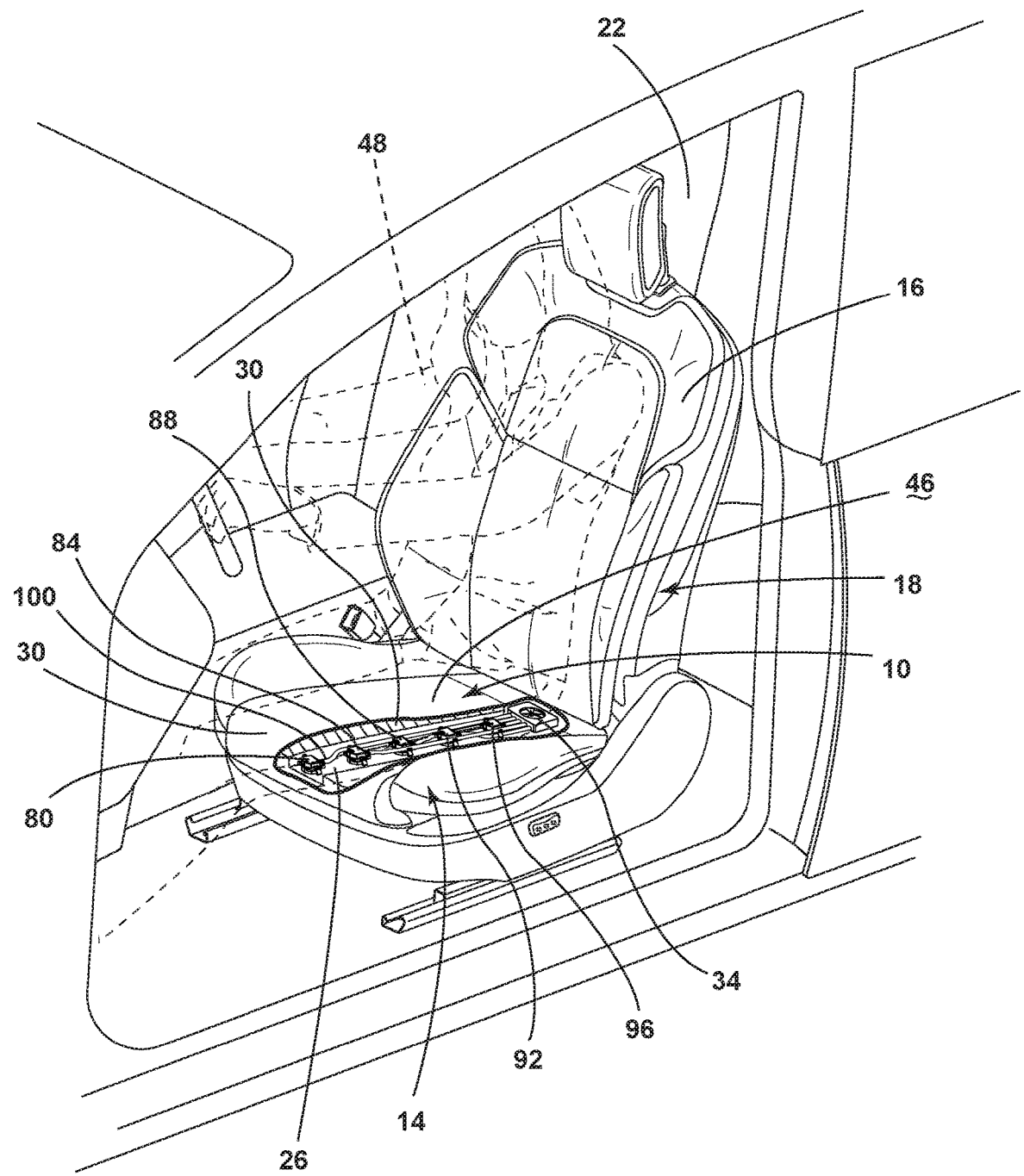
FIG. 1 is a cutaway side perspective view of a seating assembly with a temperature controlled ventilation system in a vehicle, according to an embodiment.

For purposes of description herein, the terms "upper," "lower," "right," "left," "rear," "front," "vertical," "horizontal," and derivatives thereof shall relate to the disclosure as oriented in FIG. 1. However, it is to be understood that the disclosure may assume various alternative orientations, except where expressly specified to the contrary. It is also to be understood that the specific devices and processes illustrated in the attached drawings, and described in the following specification are simply exemplary aspects of the inventive concepts defined in the appended claims. Hence, specific dimensions and other physical characteristics relating to the embodiments disclosed herein are not to be considered as limiting, unless the claims expressly state otherwise.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

As required, detailed embodiments of the present disclosure are disclosed herein; however, it is to be understood that the disclosed embodiments are merely exemplary of the disclosure that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present disclosure.

Referring to FIGS. 1-17, an embodiment of the temperature controlled ventilation system 10 is shown in the seat 14 of a seating assembly 18 within a vehicle cabin 22. The seating assembly 18 comprises a seat 14 and a seatback 16. The temperature controlled ventilation system 10 is shown disposed above the seat pan 26 and below the seat cushion 30. The temperature controlled ventilation system 10 is selectively and alternatively operable to deliver conditioned air to the seat surface 46 and waste air away from the seat surface 46. In various embodiments, the conditioned air is cooled airflow (arrow 124 in FIGS. 3, 14, and 15), and the waste air is heated airflow (arrow 128 in FIGS. 3, 14, and 15). The temperature controlled ventilation system 10 includes an air mover 34, one or more thermoelectric modules 80, and one or more inlet tubes 100. One or more outlet tubes 44 deliver the conditioned air from the one or more thermoelectric modules 80 to the seat surface 46. Conditioned air refers to air that is delivered to the seat surface 46. Waste air refers to air that is delivered away from the seat surface 46. The conditioned air that leaves the seat surface 46 cools or heats the skin of the occupant 48 and penetrates the clothing of the occupant 48.

FIG. 1 shows a cutaway view of the seat 14 with a temperature controlled ventilation system 10 disposed below a leg of the occupant 48. The temperature controlled ventilation system 10 includes first, second, third, fourth, and fifth thermoelectric modules 80, 84, 88, 92, 96.

Figure 2:
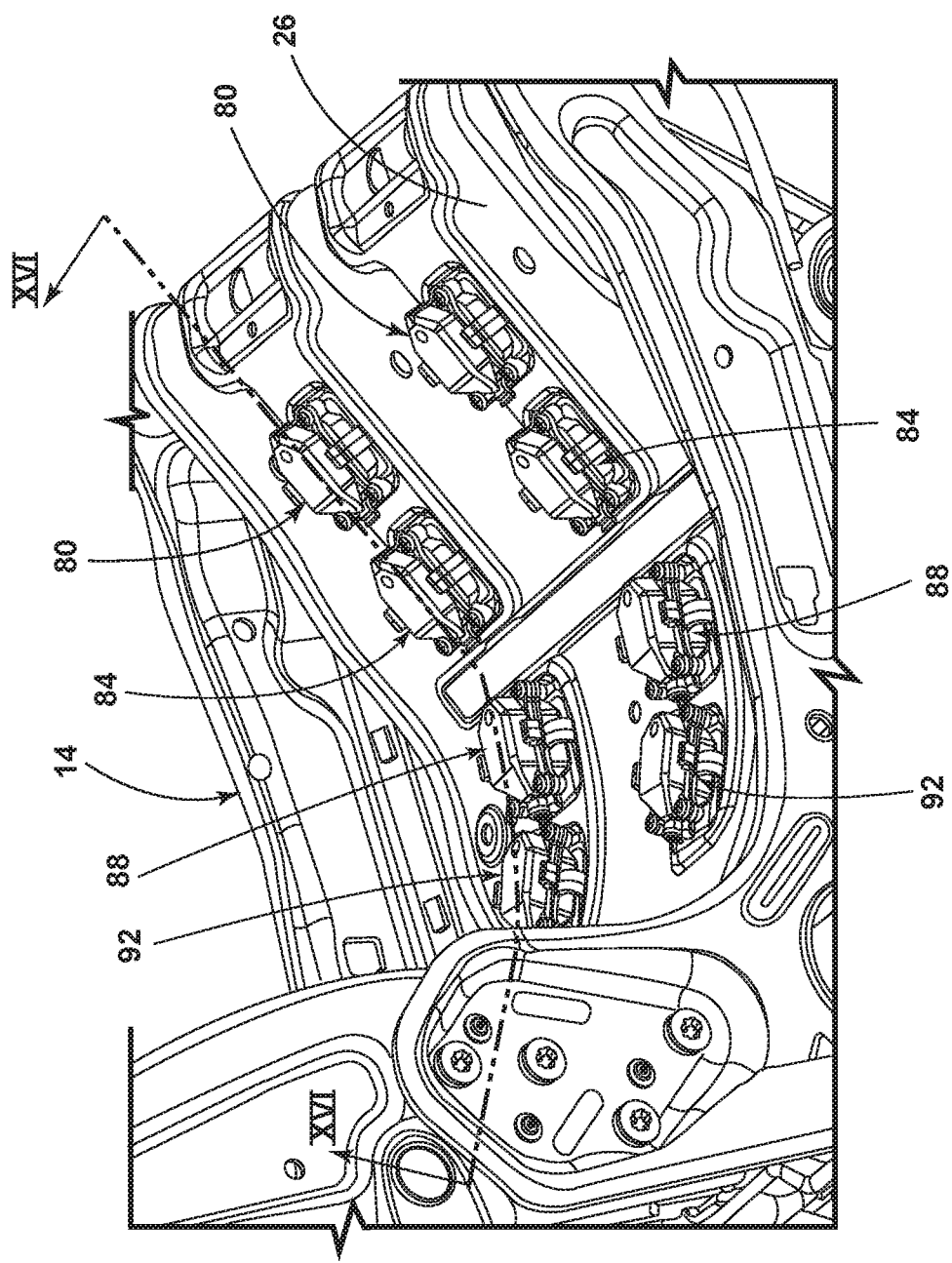
FIG. 2 is a side perspective view of a seat pan with thermoelectric modules, according to an embodiment.

FIG. 2 shows two sets of four thermoelectric modules 80, 84, 88, 92 disposed above the seat pan 26. The thermoelectric modules 80, 84, 88, 92 may be located above apertures 76 in the seat pan 26. The thermoelectric modules 80, 84, 88, 92 are disposed below the legs of the occupant 48.

Figure 3:
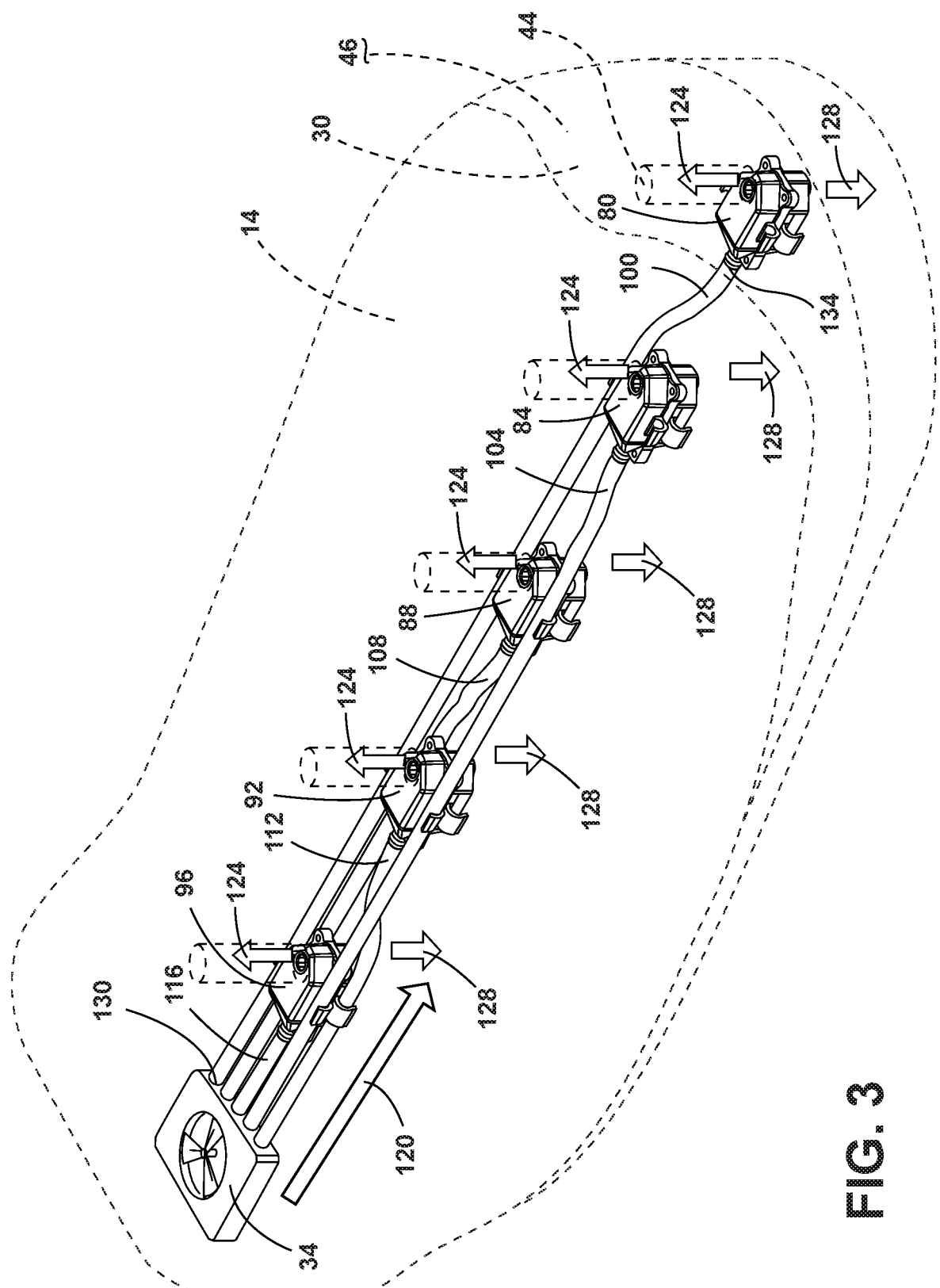
FIG. 3 is a cutaway perspective view of a seat with the temperature controlled ventilation system of FIG. 1.
Figure 4:
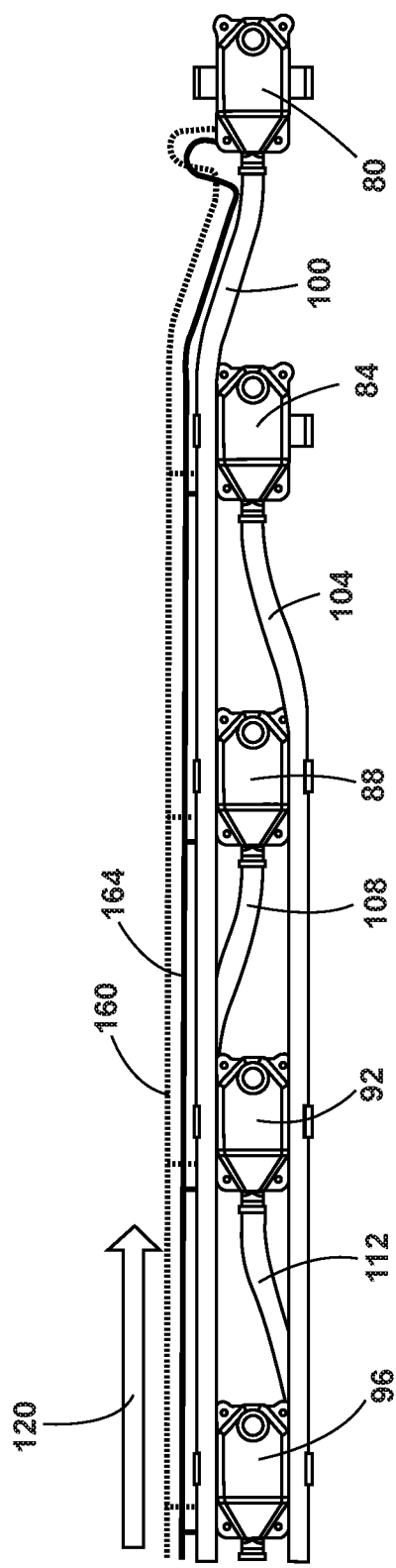
FIG. 4 is a top elevational view of a portion of the temperature controlled ventilation system of FIG. 1.

Referring to FIGS. 3-4, an embodiment of the temperature controlled ventilation system 10 with first, second, third, fourth and fifth thermoelectric modules 80, 84, 88, 92, 96 is shown within a cutaway cushion 30 of seat 14. The first, second, third, fourth and fifth thermoelectric modules 80, 84, 88, 92, 96 each receive air from respective first, second, third, fourth, and fifth inlet tubes 100, 104, 108, 112, 116. Ambient air (arrow 120) leaves the air mover 34 and travels through the inlet tubes 100, 104, 108, 112, 116 to the respective thermoelectric modules 80, 84, 88, 92, 96. Cooled air (arrows 124) leaves the thermoelectric modules 80, 84, 88, 92, 96 in a direction toward the seat surface 46 through outlet tubes 44. Heated air (arrows 128) leaves the thermoelectric modules 80, 84, 88, 92, 96 in a direction away from the seat surface 46. The first end 130 of each inlet tube 100, 104, 108, 112, 116 is coupled to an air mover 34. The second end 134 of each inlet tube 100, 104, 108, 112, 116 is attached to an inlet port 138 of respective first, second, third, fourth, fifth thermoelectric modules 80, 84, 88, 92, 96. The thermoelectric modules 80, 84, 88, 92, 96 each include clips 150. The clips 150 extend from the sides of the thermoelectric modules 80, 84, 88, 92, 96. Second thermoelectric module 84 is clipped to first inlet tube 100. Third thermoelectric module 88 is clipped to first inlet tube 100 and second inlet tube 104. Fourth thermoelectric module 92 is clipped to first inlet tube 100, second inlet tube 104, and third inlet tube 108. Fifth thermoelectric module 96 is clipped to first inlet tube 100, second inlet tube 104, third inlet tube 108, and fourth inlet tube 112.

Referring to FIG. 4, the temperature controlled ventilation system 10 is powered by a positive supply wire 160 and a negative supply wire 164 that run along the length of the first inlet tube 100. Each thermoelectric module 80, 84, 88, 92, and 96 receives power from the positive and negative supply wires 160, 164. According to one embodiment, each wire is a 12-volt wire. The positive and negative supply wires 160, 164 are clipped to the first inlet tube 100. A wire harness supplies power to the positive supply wire 160 and the negative supply wire 164 at select voltages.

Figure 6:
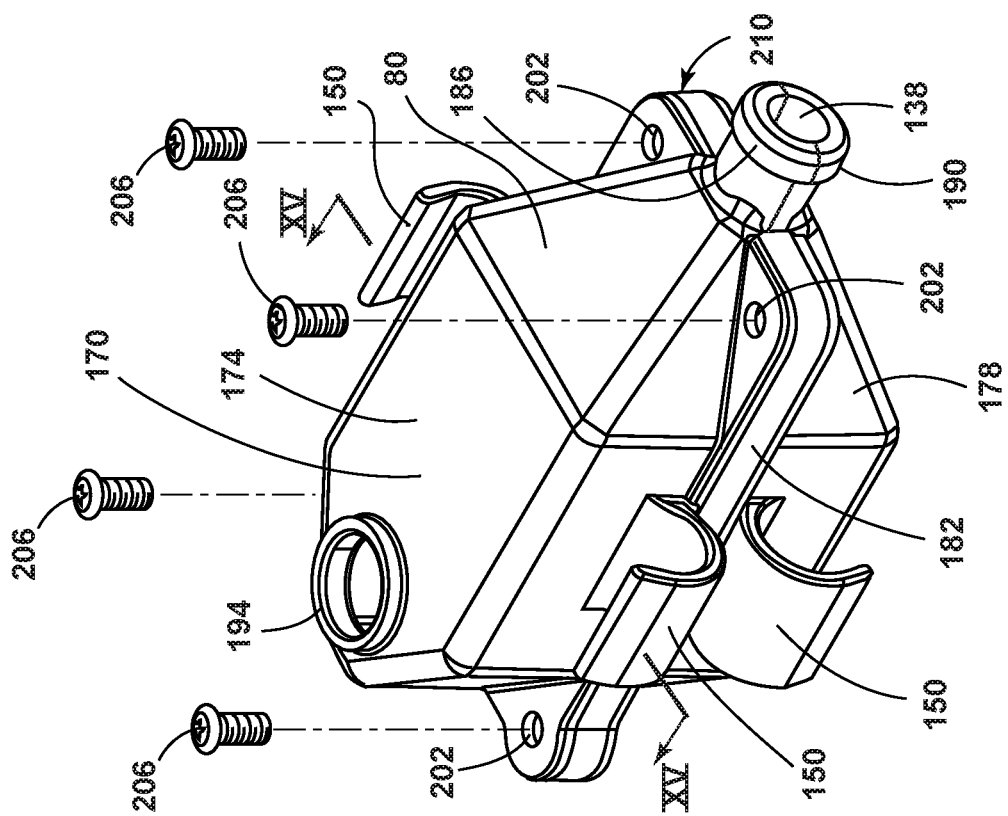
FIG. 6 is a back perspective view of a thermoelectric module.
Figure 5:
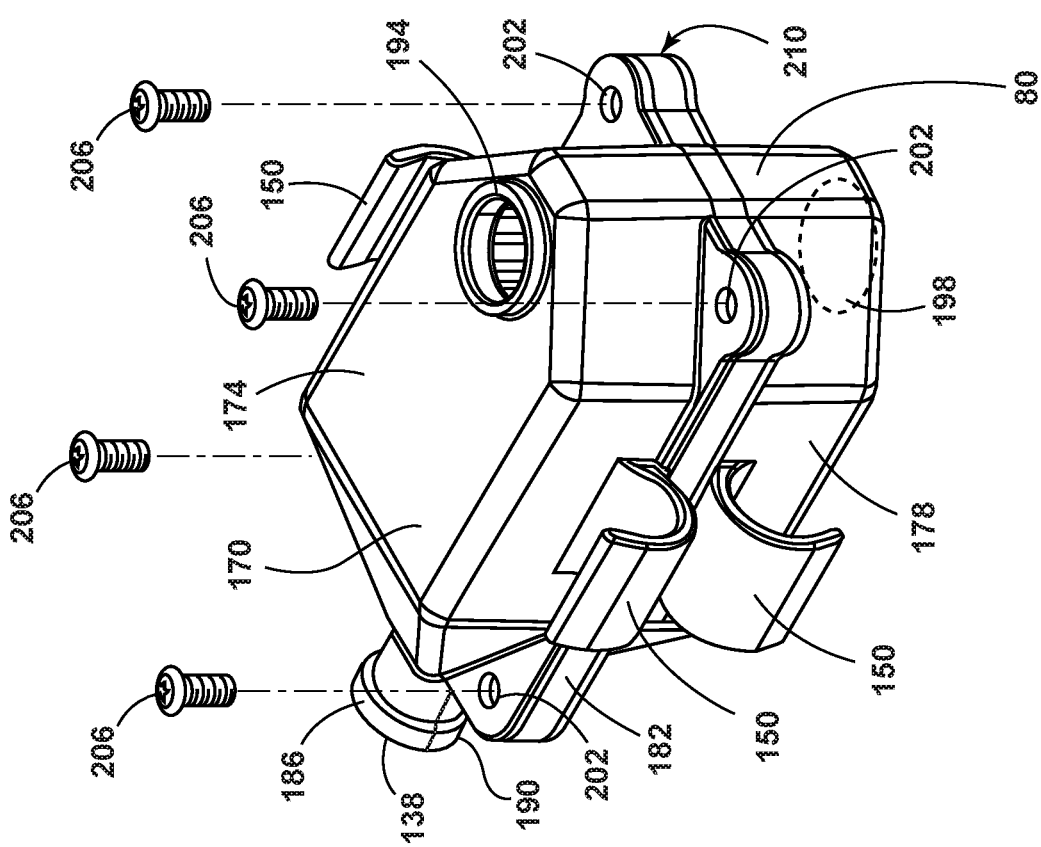
FIG. 5 is a front perspective view of a thermoelectric module.

Referring to FIGS. 5 and 6, respective front and back perspective views of a thermoelectric module 80 are shown. The thermoelectric module 80 includes a housing 170 with a first shell 174 and a second shell 178. An elastomeric gasket 182 is disposed between the first shell 174 and the second shell 178. The housing 170 includes an inlet port 138 made of a first tubular portion 186 of the first shell 174 and a second tubular portion 190 of the second shell 178. Clips 150 are disposed on either side of the first shell 174. Clips 150 are disposed on either side of the second shell 178. A first outlet port 194 is disposed in the first shell 174. A second outlet port 198 is disposed in the second shell 178. Holes 202 for receiving fasteners 206 are disposed in the corner areas 210 of the first shell 174, the elastomeric gasket 182 and the second shell 178.

Figure 7:
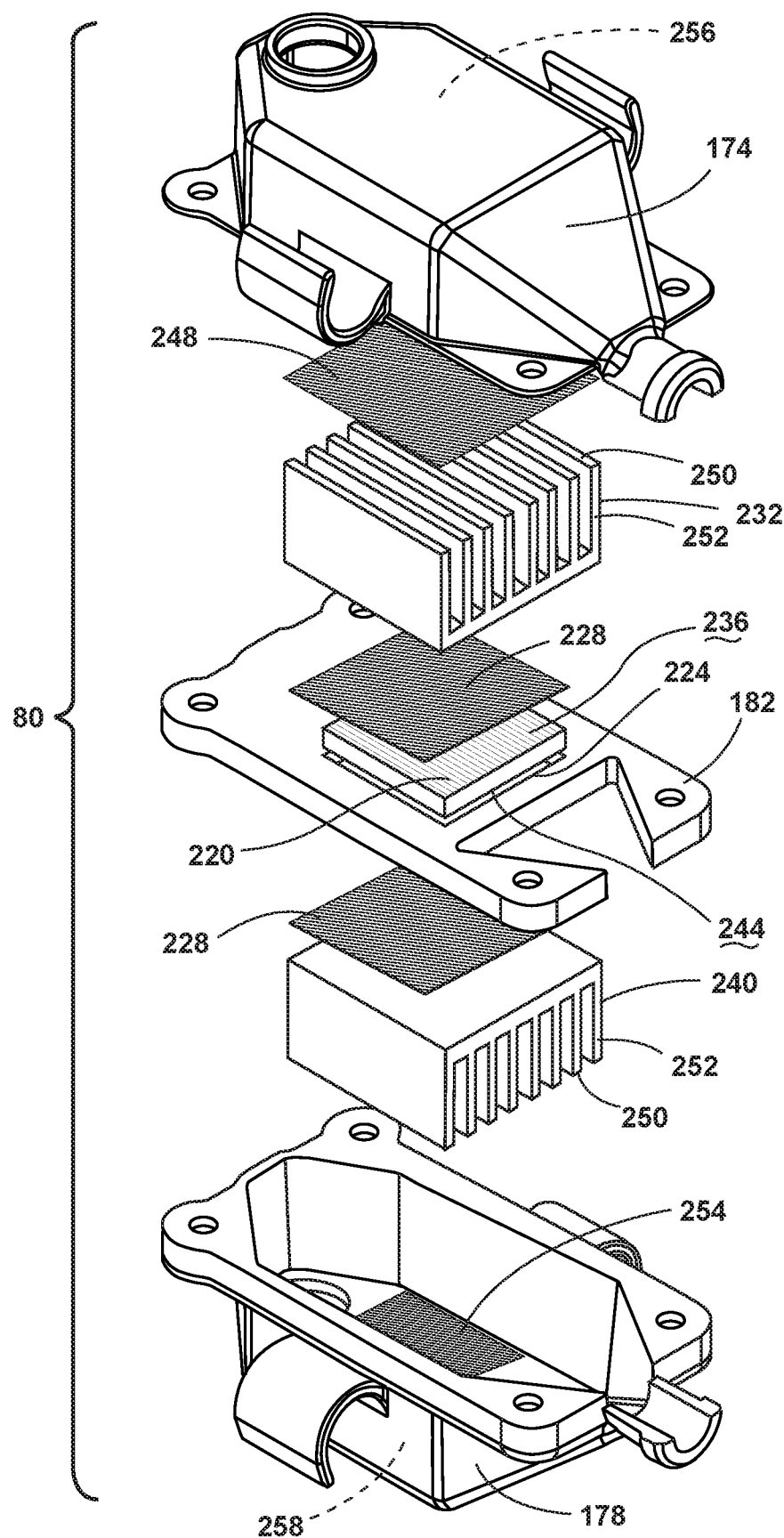
FIG. 7 is an exploded view of a thermoelectric module.

Referring now to FIG. 7, an exploded view of a thermoelectric module 80 is shown. The thermoelectric module 80 includes a thermoelectric device 220 disposed within an aperture 224 in an elastomeric gasket 182. A thermally conductive adhesive 228 attaches the first heat sink 232 to the first surface 236 of the thermoelectric device 220. A thermally conductive adhesive 228 attaches the second heat sink 240 to the second surface 244 of the thermoelectric device 220. In various embodiments, the thermally conductive adhesive 228 may be a glue or a tape. A first elastomeric sheet 248 is disposed between the tips 250 of the fins 252 of the first heat sink 232 and the first shell 174. A second elastomeric sheet 254 is disposed between the tips 250 of the fins 252 of the second heat sink 240 and the second shell 178. A first chamber 256 is located between a wall defined by the elastomeric gasket 182 and the thermoelectric device 220 and the first shell 174. A second chamber 258 is located between a wall defined by the elastomeric gasket 182 and the thermoelectric device 220 and the second shell 178.

Referring to FIG. 8, a view of the thermoelectric module 80 is shown with the first shell 174 of the housing 170 removed from the housing 170. The second shell 178 retains the elastomeric gasket 182, a first heat sink 232, and a second heat sink 240. A thermoelectric device 220 is disposed in an aperture 224 in the elastomeric gasket 182 and is sandwiched between a first heat sink 232 and a second heat sink 240. The first heat sink 232 is disposed on a first surface 236 of the thermoelectric device 220 and a first surface 264 of the elastomeric gasket 182. The second heat sink 240 is disposed on a second surface 244 of the thermoelectric device 220 and a second surface 268 of the elastomeric gasket 182. The thermoelectric device 220 may be positioned in an aperture 224 in the elastomeric gasket 182 to minimize heat leakage around the thermoelectric device 220. The material of the elastomeric gasket 182 is typically soft. The first surface 236 and the second surface 244 of the thermoelectric device 220 are typically a ceramic material. The first heat sink 232, the second heat sink 240, the thermoelectric device 220 and the thermally conductive adhesive 228 (FIG. 7) form a sandwich assembly 272. The elastomeric gasket 182 and the sandwich assembly 272 float within the housing 170 so that the elastomeric gasket 182 and the sandwich assembly 272 are not a stressed system during the operation of the thermoelectric device 220. In various embodiments, shear stresses may act on the first and second surfaces 236, 244 of the thermoelectric device 220 and on the thermally conductive adhesive 228 as the cooling and heating of the first and second heat sinks 232, 240 causes the first and second heat sinks 232, 240 to expand and contract and to exert shear stresses on the first surface 236 and the second surface 244. The thermally conductive adhesive 228 may absorb some of the stresses exerted on the first and second ceramic surfaces 236, 244 by the expansion and contraction of the first and second heat sinks 232, 240 during cooling and heating of the first and the second heat sinks 232, 240. In various embodiments, the first surface 236 and the second surface 244 experience negligible expansion and negligible contraction. In various embodiments, pressurized air traveling through the thermoelectric module 80 may exert additional stresses on the sandwich assembly 272. In various embodiments, the cold surface (first or second surface 236, 244) of the thermoelectric device 220 may be approximately 35 degrees Celsius, and the respective hot surface (second or first surface 244, 236) of the thermoelectric device 220 may be approximately 50 degrees Celsius. Therefore, it is advantageous that the elastomeric gasket 182 is flexible and can absorb some of the stresses and movements of the sandwich assembly 272 and the pressurized air traveling through the thermoelectric module 80.

Referring to FIG. 9, a top elevational view of the thermoelectric module 80 with the first shell 174 removed is shown. Extensions 280, 284 of the positive and negative wires 160, 164 attached to the positive and negative leads 288, 292 of the thermoelectric device 220 are shown. The thermoelectric device 220 is disposed within the aperture 224 of the elastomeric gasket 182.

Figure 10:
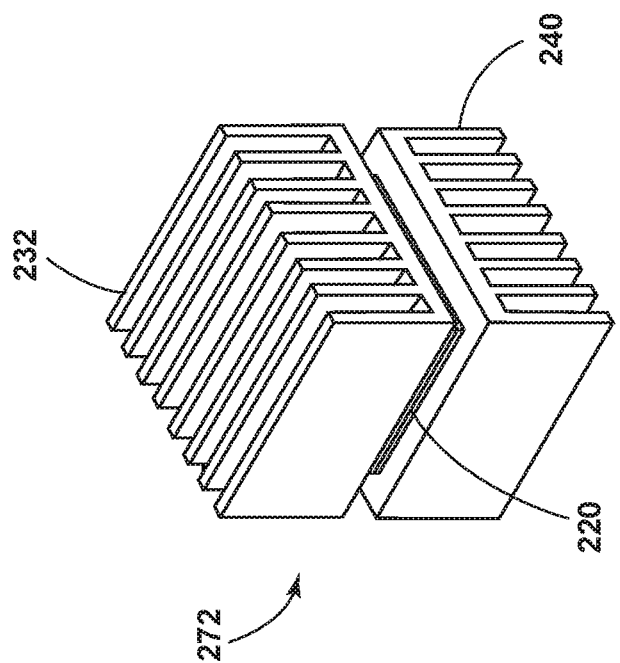
FIG. 10 is a perspective view of a thermoelectric device with a first heat sink and a second heat sink.

Referring to FIG. 10, the sandwich assembly 272 is shown. The first heat sink 232 and the second heat sink 240 are shown attached to the thermoelectric device 220 and the second surface 244 of the thermoelectric device 220.

Figure 11:
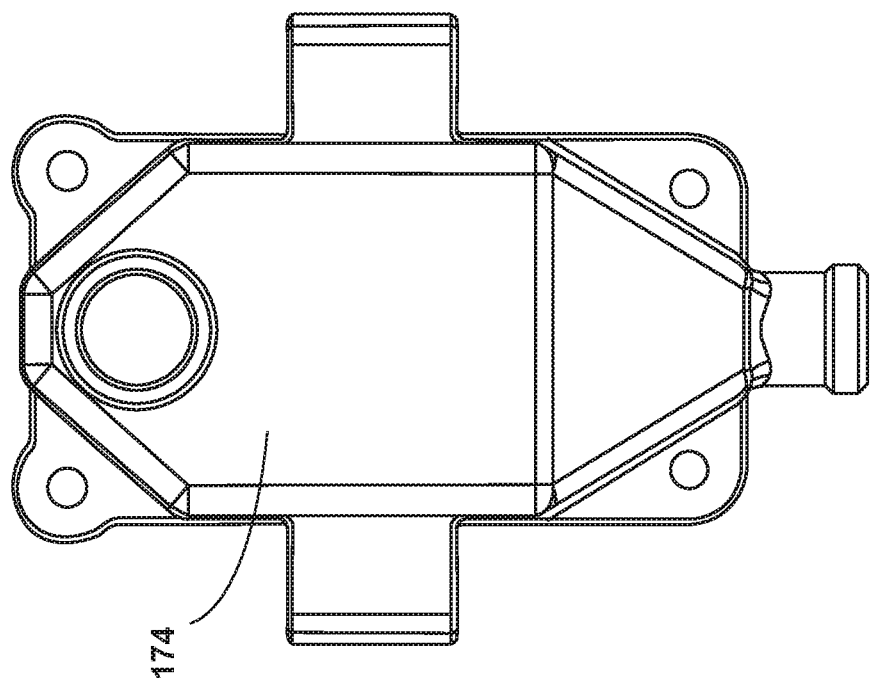
FIG. 11 is a top elevational view of a first shell of a housing.

Referring to FIG. 11, a top elevational view of the first shell 174 of the housing 170 is shown. In various embodiments, the first shell 174 of the housing 170 and the second shell 178 of the housing 170 are substantially identical, interchangeable parts. In various embodiments, the first shell 174 and the second shell 178 may be different parts.

Figure 12:
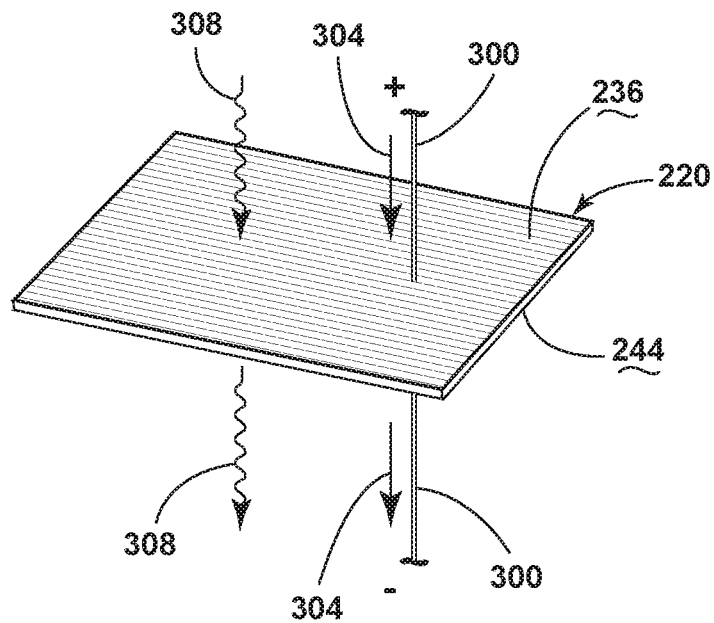
FIG. 12 is an electricity/heat schematic showing heat traveling from an upper surface of a thermoelectric device to a lower surface of a thermoelectric device according to an embodiment.
Figure 13:
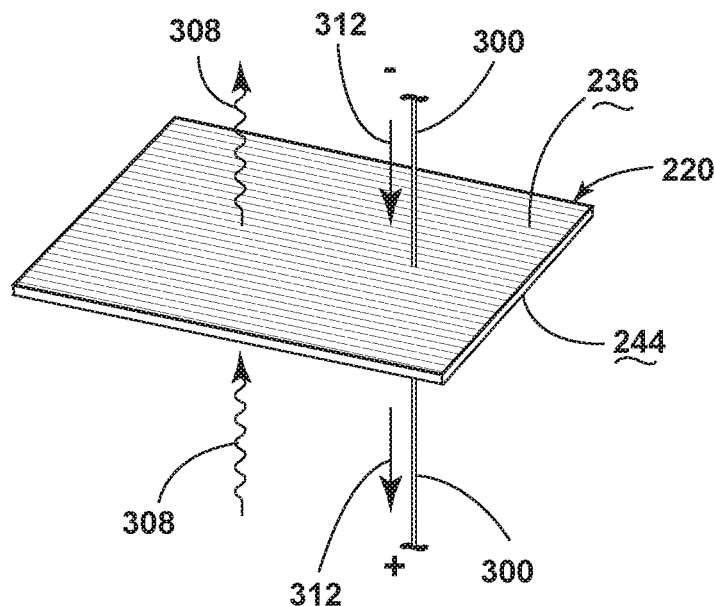
FIG. 13 is an electricity/heat schematic showing heat traveling from a lower surface of a thermoelectric device to an upper surface of a thermoelectric device according to an embodiment.
Figure 15:
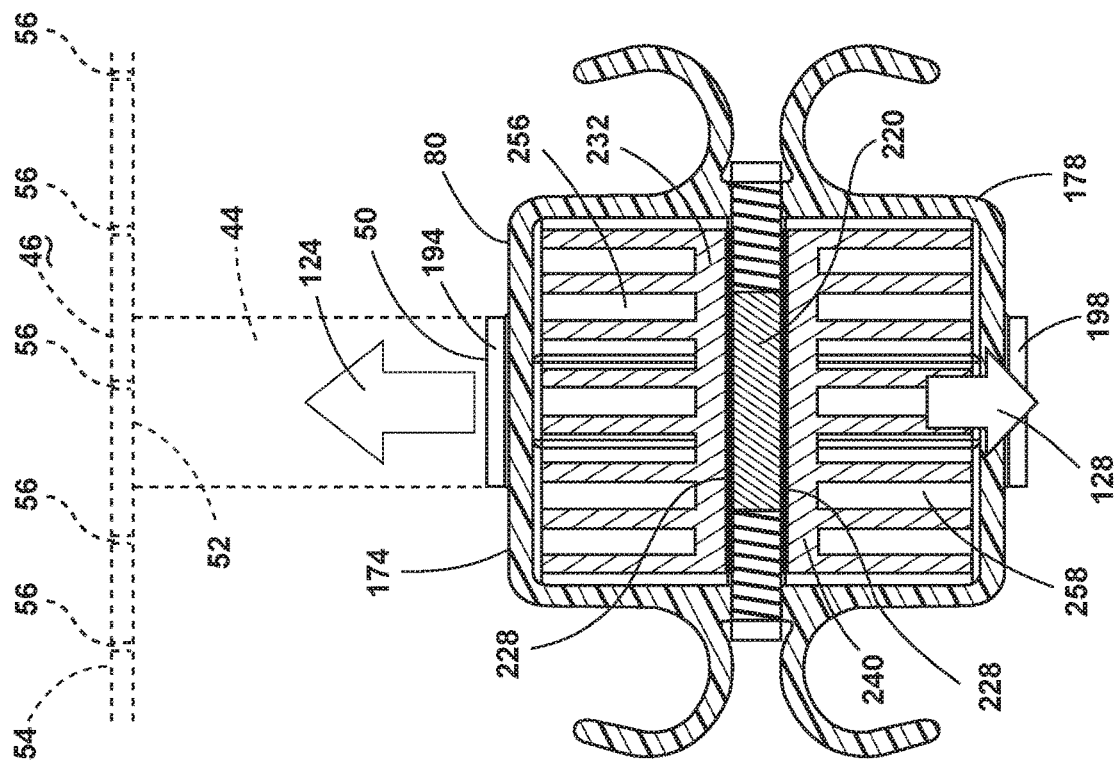
FIG. 15 is a cross-sectional view of a thermoelectric module taken along XV-XV of FIG. 6 with arrows depicting airflow.
Figure 14:
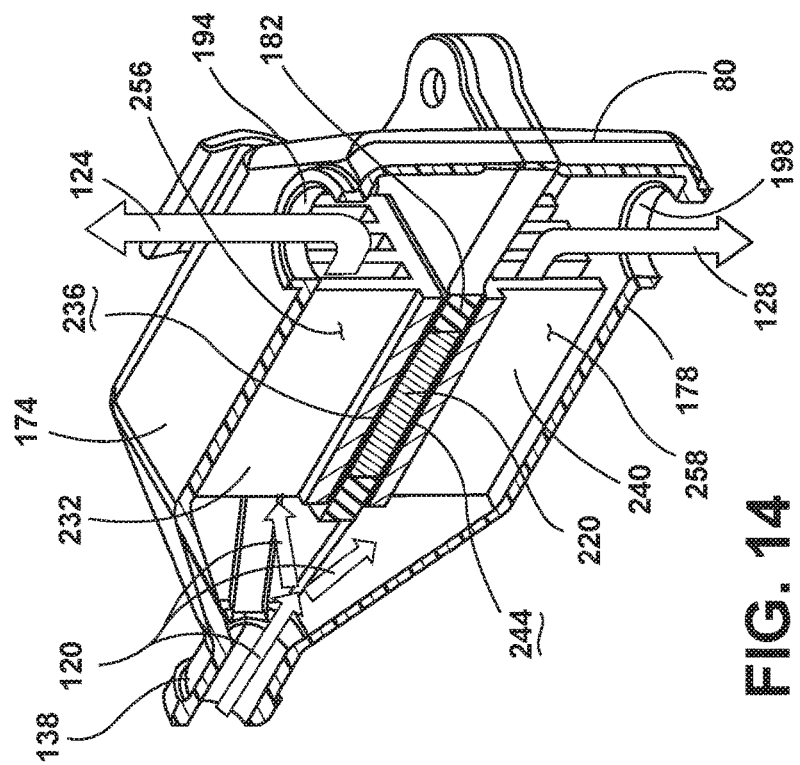
FIG. 14 is a cutaway view of a thermoelectric module with arrows depicting airflow.

Referring to FIGS. 12-13, schematics of current directions and heat flows of the thermoelectric device 220 in the occupant 48 cooling (FIG. 12) and occupant 48 heating (FIG. 13) modes are shown. Referring to FIG. 12, current flow that is positive to negative from the first surface 236 of the thermoelectric device 220 to the second surface 244 of the thermoelectric device 220 cools the first surface 236. As shown in FIG. 12, current 300 flows into and out of the thermoelectric device 220 in the depicted positive to negative direction. Arrows 304 depict the directional flow of current 300. With reference to FIGS. 12 and 14-15, heat 308 flows from the cold thermoelectric device 220 first surface 236 to the hot thermoelectric device 220 second surface 244, thereby cooling air in the first chamber 256 and heating the air in the second chamber 258.

With reference to FIG. 13, current flow that is negative to positive from the first surface 236 of the thermoelectric device 220 to the second surface 244 of the thermoelectric device 220 heats the first surface 236 of the thermoelectric device 220. As shown in FIG. 13, current 300 flows into and out of the thermoelectric device 220 in the depicted negative to positive direction. Arrows 312 depict the directional flow of current 300. With reference to FIGS. 13-15, heat 308 flows from the cold thermoelectric device second surface 244 to the hot thermoelectric device first surface 236, thereby cooling air in the second chamber 258 and heating air in the first chamber 256.

Referring to FIG. 14, a cutaway view of a thermoelectric module 80 is shown. Ambient air enters the inlet port 138, as shown by arrows 120. The ambient air enters the first chamber 256 and the second chamber 258. The heat from the ambient air that enters the first chamber 256 is absorbed by the cool fins 252 of the first heat sink 232. The hot fins 252 of the second heat sink 240 transfer heat to the ambient air that enters the second chamber 258. Consequently, cooled air depicted by arrows 124 leaves the first outlet port 194 of the first chamber 256, and heated air depicted by arrows 128 leaves the second outlet port 198 of the second chamber 258. The first and second heat sinks 232, 240 are made of a conductive material such as aluminum or copper. The elastomeric gasket 182 insulates the first surface 236 of the thermoelectric device 220 from the second surface 244 of the thermoelectric device 220 and the air in the first chamber from the air in the second chamber 258. The first heat sink 232 comprises fins 252 extending from the first surface 236 of the thermoelectric device 220 into the first chamber 256. The second heat sink 240 comprises fins 252 extending from the second surface 244 of the thermoelectric device 220 into the second chamber 258. A first elastomeric sheet 248 is disposed between the tips 250 of the fins 252 of the first heat sink 232 and the first shell 174. A second elastomeric sheet 254 is disposed between the tips 250 of the fins 252 of the second heat sink 240 and the second shell 178.

Referring to FIG. 15, a cross-sectional view of a thermoelectric module 80 taken along line XV-XV of FIG. 5 is shown. Cooled air shown by arrow 124 leaves the first outlet port 194, and heated air shown by arrow 128 leaves the second outlet port 198. As previously discussed with reference to FIGS. 12-14, the direction of current flow in the thermoelectric device 220 determines whether the first chamber 256 is cooled and the second chamber 258 is heated or whether the first chamber 256 is heated and the second chamber 258 is cooled. The voltage amount supplied by the positive and negative wires 160, 164 determines the temperature differential across the thermoelectric device first surface 236 and the thermoelectric device second surface 244. Outlet tube 44 has a first end 50 at the first outlet port 194 and a second end 52 proximate the seat surface 46. A perforated trim 54 is disposed at the seat surface 46. Air (arrow 124) travels through perforations 56 in the perforated trim 54.

Figure 16:
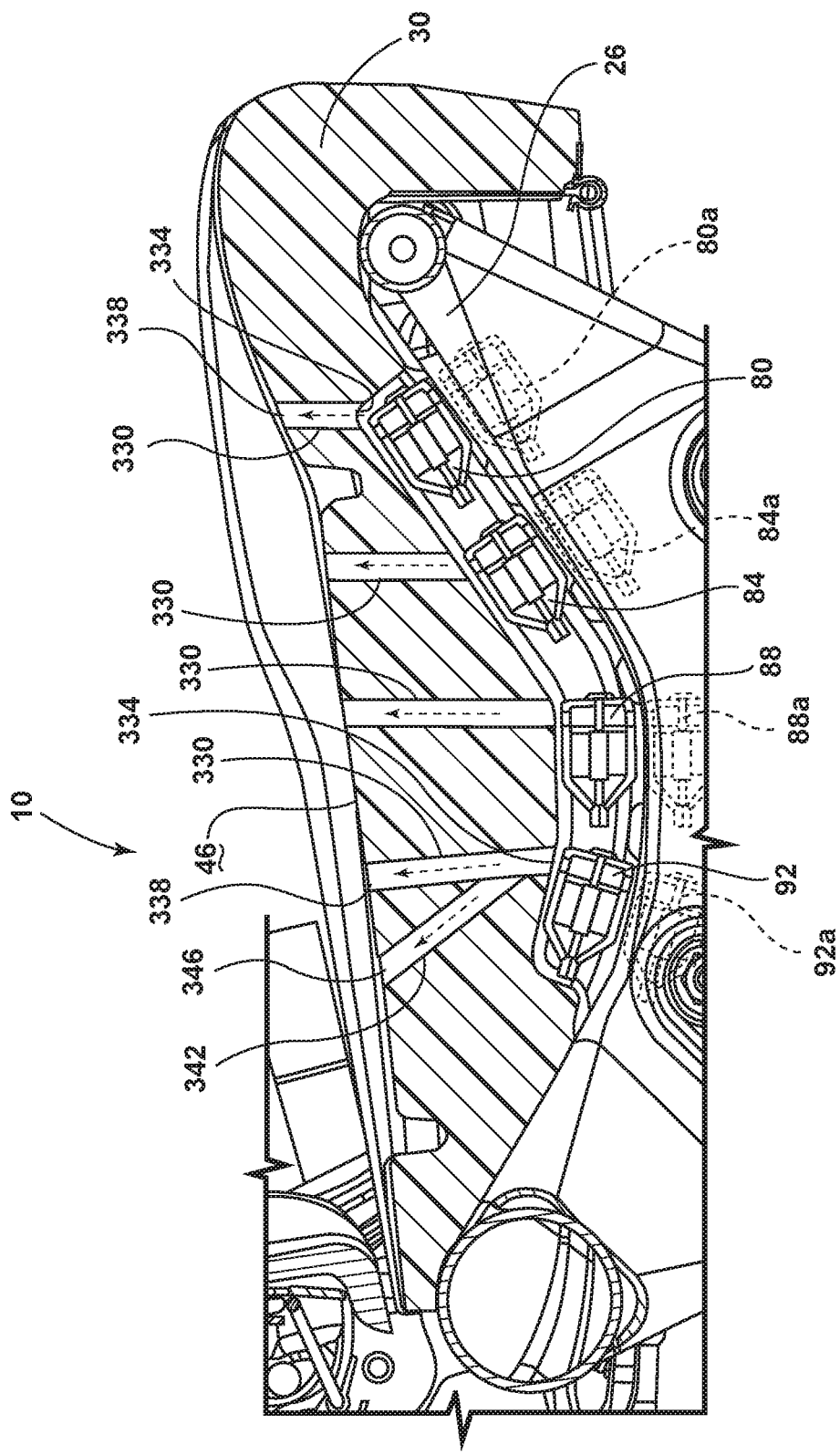
FIG. 16 is a cross-sectional view taken along line XVI-XVI of FIG. 2 showing thermoelectric modules disposed above the seat pan or below the seat pan according to various embodiments.

Referring to FIG. 16, an embodiment of the temperature controlled ventilation system 10 is shown. The thermoelectric modules 80, 84, 88, 92 are shown disposed above the seat pan 26. In an alternative embodiment, thermoelectric modules 80a, 84a, 88a, 92a are disposed below the seat pan 26. A seat cushion 30 is disposed above the seat pan 26. Channels 330 extend through the seat cushion 30. The channels 330 comprise a first end 334 and a second end 338. The first end 334 of the channels 330 is adjacent to the first outlet ports 194 of the thermoelectric modules 80, 84, 88, 92. The channels 330 may be molded into the seat cushion 30. The seat cushion 30 may be molded from an EPP foam material. In various embodiments, a channel 330 may include one or more branches 342 with outlets 346 near the seat surface 46.

From the foregoing and with reference to FIGS. 1-16, a temperature controlled ventilation system 10 for a vehicle seating assembly 18 includes a thermoelectric module 80. The thermoelectric module 80 includes a thermoelectric device 220 disposed within a housing 170 including a first chamber 256, a second chamber 258, an inlet port 138, a first outlet port 194 disposed in the first chamber 256, and a second outlet port 198 disposed in the second chamber 258. The temperature controlled ventilation system 10 for a vehicle seating assembly 18 also includes an inlet tube 100 coupled to the inlet port 138 and an air mover 34 for moving air through the inlet tube 100, into the inlet port 138 and into the first and second chambers 256, 258. The thermoelectric device 220 is selectively and alternatively operable to cool air in the first chamber 256 and to heat air in the second chamber 258 or to heat air in the first chamber 256 and to cool air in the second chamber 258.

Referring again to FIGS. 1-16, the air mover 34 may be a compressor that provides pressurized ambient air to the inlet tubes 100, 104, 108, 112, 116. The compressor may provide pressurized ambient air with pressure that is approximately 2.0 to 50 times higher than the pressurized ambient air that a typical vehicle seating assembly 18 air mover 34 provides. For example, according to various embodiments, a typical pressure of a vehicle seat fan may be approximately 0.066 psig. In various embodiments, the pressure that a typical compressor generates may be approximately 3.0 psig, which is approximately 50 times higher than 0.066 psig. The increased air pressure of the compressor has numerous advantages over the air pressure generated by a typical air mover 34. The increased air pressure of the compressor allows a more flexible inlet tube 100 with a smaller diameter to be used in the temperature controlled ventilation system 10. The increased air pressure of the compressor provides usable residual air pressure at the first outlet port 194 and the second outlet port 198 that enables the rapid removal of conditioned air (e.g., cooled air, FIGS. 3, 14 and 15) and waste air (e.g., heated air, FIGS. 3, 14, and 15) from the respective first outlet port 194 and second outlet port 198. The pressurized air that travels to the seat surface 46 through the outlet tubes 44 or channels 330 in the seat cushion 30 cools or heats the skin of an occupant 48 and penetrates the clothing of the occupant 48. The second end 52 of the outlet tube 44 or second end 338 of the channel 330 release air beneath a perforated seat trim 54. Pressurized air travels through perforations 56 in the perforated trim 54 to cool or heat the occupant. In various embodiments, the one or more thermoelectric modules 80 may be located between 150 millimeters and 250 millimeters from the seat surface 46. The pressurized air allows for a location of the thermoelectric modules 80, 84, 88, 92, 96 that is removed from the seat surface 46. The air mover 34 provides air that is sufficiently pressurized to reach the seat surface 46 to deliver a cooling or heating effect to the occupant 48.

Figure 17:
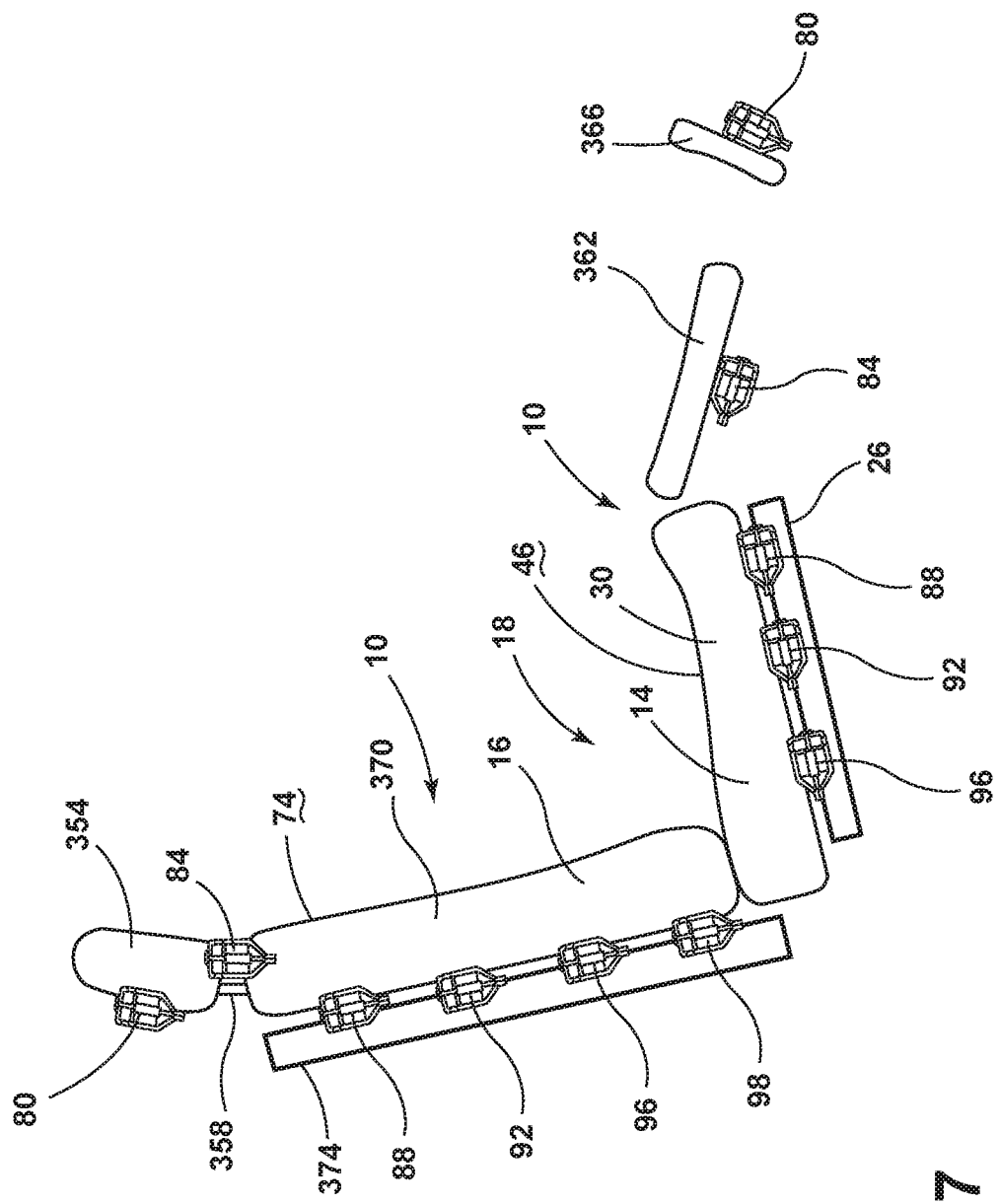
FIG. 17 is a schematic view showing thermoelectric modules on a seating assembly according to various embodiments.

FIG. 17 shows a seating assembly 18 schematic showing various locations of temperature controlled ventilation system 10 according to various embodiments of a temperature controlled ventilation system 10. The thermoelectric modules 80, 84, 88, 92, 96 may be part of a temperature controlled ventilation system 10 that cools and heats the foot support 366, leg support 362, and seat surface 46. In various embodiments, a temperature controlled ventilation system 10 disposed along a headrest 354, headrest support 358, and seatback 16 may include thermoelectric modules 80, 84, 88, 92, 96, 98 that provide ventilated temperature control to a seat seatback surface 74 to comfort the back, a headrest 354 to comfort the head or scalp, and a headrest support 358 to comfort the neck. In various embodiments, the temperature controlled ventilation system 10 may be arranged with one or more thermoelectric modules 80 disposed in a variety of locations in the seating assembly 18 to provide conditioned air to a variety of areas (e.g., seat surface 46, seatback surface 74) of the seating assembly 18. One or more thermoelectric modules 80 may be disposed in the seat 14 between a seat cushion 30 and a cushion support structure (e.g., seat pan 26). One or more thermoelectric modules 80 may be disposed between a seatback cushion 370 and a cushion support structure (e.g., seatback frame 374).

In various embodiments, the inlet port 138 may have an inside diameter between 2.0 millimeters and 8.0 millimeters. In various embodiments, the inlet port 138 may have an inside diameter of 4.0 millimeters.

In various embodiments, one or more thermoelectric modules 80 of a temperature controlled ventilation system 10 may be arranged within the seating assembly 18 to provide a cocoon of conditioned air to the occupant 48. For example, the outlet tubes 44 of one or more thermoelectric modules 80 may be routed into the bolsters of the seat 14 and the seatback 16.

In various embodiments, the thermoelectric modules 80 may be individually electrically controlled from a control unit to cool or heat various areas (e.g. seat surface 46, seatback surface 74) of the seating assembly 18.

In various embodiments, the occupant 48 may cool or heat different body areas as desired.

The temperature controlled ventilation system 10 may also be referred to as a thermally conductive ventilation system.

A variety of advantages may be derived from the use of the present disclosure. A pressurized ambient air supply, in combination with the housing 170, provides compact containment of conditioned air in the first chamber 256 and waste air in the second chamber 258. The pressurized ambient air that enters the one or more thermoelectric modules 80 allows a greater volume of air to be supplied to the temperature controlled ventilation system 10 to increase the thermoelectric device 220 efficiency and provide a greater cooling or heating effect to the occupant 48. The individual inlet tubes 42 for the one or more thermoelectric modules 80 allow the one or more thermoelectric modules 80 to be widely distributed throughout the seating assembly 18 without loss of efficiency of air delivery to the one or more thermoelectric modules 80. The one or more thermoelectric modules 80 are compact, and they may be individually arranged throughout a seating assembly 18 in a variety of geometries. Additionally, the pressure enhanced ambient air supply provides multiple zones that can offer varying temperatures and can individually heat or cool as required.

The clips 150 on the sides of the thermoelectric modules 80, 84, 88, 92, 96 provide a chain of modules that is self-contained and compact. The heat sinks 232, 240 within a thermoelectric modules 80 enable a compact high efficiency heat transfer adequate to maximize the performance of the thermoelectric device 220.

It will be understood that construction of the described disclosure, and other components, is not limited to any specific material. Other exemplary embodiments of the disclosure disclosed herein may be formed from a wide variety of materials, unless described otherwise herein.

For purposes of this disclosure, the term "coupled" (in all of its forms: couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature, or may be removable or releasable in nature, unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes, and proportions of the various elements values of parameters, mounting arrangements, use of materials, color, orientations, etc.) without materially departing from the novel teachings and advantages of the subject matter recited. For example, elements shown as integrally formed, the operation of the interfaces may be reversed or otherwise varied, the length or width of the structures and/or members or connector to other elements of the system may be varied, and the nature or numeral of adjustment positions provided between the element may be varied. It should be noted that the elements, and/or assemblies of the system may be constructed from any of the wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes, or steps within described processes, may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and, further, it is to be understood that such concepts are intended to be covered by the following claims, unless these claims, by their language, expressly state otherwise. Further, the claims as set forth below, are incorporated into and constitute part of this Detailed Description.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A temperature controlled ventilation system for a vehicle seating assembly, comprising:
a thermoelectric module comprising:
a thermoelectric device disposed within a housing comprising a first chamber, a second chamber, an inlet port, a first outlet port disposed in the first chamber, and a second outlet port disposed in the second chamber;
an inlet tube coupled to the inlet port; and
an air mover for moving air through the inlet tube, into the inlet port and into the first and second chambers, wherein the thermoelectric device is selectively and alternatively operable to cool air in the first chamber and to heat air in the second chamber or to heat air in the first chamber and to cool air in the second chamber, wherein the housing further comprises a first shell and a second shell; and further comprising:
an elastomeric gasket disposed between the first shell and the second shell, wherein the thermoelectric device is disposed in an aperture in the elastomeric gasket, wherein the first chamber is located between a wall defined by the elastomeric gasket and the thermoelectric device and the first shell, and wherein the second chamber is located between the wall defined by the elastomeric gasket and the thermoelectric device and the second shell; and further comprising:
a first heat sink disposed on a first surface of the thermoelectric device;
a second heat sink disposed on a second surface of the thermoelectric device; and
a first outlet tube comprising a first end and a second end, wherein the first end is attached to the first outlet port and the second end is disposed proximate a seating surface.

2. The temperature controlled ventilation system for a vehicle seating assembly of claim 1, wherein the first heat sink comprises one or more fins extending from the first surface of the thermoelectric device into the first chamber, and wherein the second heat sink comprises one or more fins extending from the second surface of the thermoelectric device into the second chamber.

3. The temperature controlled ventilation system for a vehicle seating assembly of claim 2, wherein the one or more fins extend from the first surface of the thermoelectric device to the first shell, and wherein the one or more fins extend from the second surface of the thermoelectric device to the second shell.

4. The temperature controlled ventilation system for a vehicle seating assembly of claim 3, further comprising a thermally conductive adhesive disposed between the first surface of the thermoelectric device and the first heat sink and the second surface of the thermoelectric device and the second heat sink.

5. The temperature controlled ventilation system for a vehicle seating assembly of claim 1, further comprising a channel in a seat cushion, wherein the channel comprises a first end and a second end, and wherein the first end is adjacent to the first outlet port and the second end is disposed proximate a seating surface.

6. A temperature controlled ventilation system for a vehicle seating assembly, comprising:
a thermoelectric module comprising:
a thermoelectric device disposed within a housing comprising a first chamber, a second chamber, an inlet port, a first outlet port disposed in the first chamber, and a second outlet port disposed in the second chamber;
an inlet tube coupled to the inlet port; and
an air mover for moving air through the inlet tube, into the inlet port and into the first and second chambers, wherein the thermoelectric device is selectively and alternatively operable to cool air in the first chamber and to heat air in the second chamber or to heat air in the first chamber and to cool air in the second chamber, wherein the thermoelectric module comprises a first thermoelectric module and a second thermoelectric module, wherein the first thermoelectric module includes a first inlet tube and the second thermoelectric module includes a second inlet tube, and wherein the second thermoelectric module is coupled to the first inlet tube.

7. The temperature controlled ventilation system for a vehicle seating assembly of claim 6, wherein the second thermoelectric module includes a clip integral to the housing of the second thermoelectric module and wherein the clip is secured to the first inlet tube.

8. A thermally conductive ventilation system comprising:
first and second thermoelectric modules;
an air mover; and
first and second inlet tubes delivering air from the air mover to the respective first and second thermoelectric modules, wherein thermoelectric devices disposed within the first and second thermoelectric modules are selectively and alternatively operable to heat and cool air within first and second chambers in the first and second thermoelectric modules, wherein the first and second thermoelectric modules comprise respective first and second housings, wherein a first clip is disposed on the first housing, wherein a second clip is disposed on the second housing, and wherein the second clip is attached to the first inlet tube.

9. The thermally conductive ventilation system of claim 8, wherein the first and second thermoelectric modules are disposed above a seat pan.

10. The thermally conductive ventilation system of claim 8, wherein the first and second thermoelectric modules are disposed below a seat pan.

11. The thermally conductive ventilation system of claim 8, further comprising:
third, fourth, and fifth thermoelectric modules, wherein the third, fourth, and fifth thermoelectric modules comprise third, fourth, and fifth housings; and
third, fourth, and fifth inlet tubes coupled to the respective third, fourth, and fifth thermoelectric modules, wherein the third housing is coupled to the first and second inlet tubes, the fourth housing is coupled to the first, second, and third inlet tubes, and the fifth housing is coupled to the first, second, third, and fourth inlet tubes.

* * * * *